(12) United States Patent
Feng et al.

(10) Patent No.: US 9,349,825 B2
(45) Date of Patent: May 24, 2016

(54) METHOD FOR MANUFACTURING GRAPHENE TRANSISTOR BASED ON SELF-ALIGNING TECHNOLOGY

(71) Applicant: THE 13TH RESEARCH INSTITUTE OF CHINA ELECTRONICS TECHNOLOGY GROUP CORPORATION, Shijiazhuang (CN)

(72) Inventors: Zhihong Feng, Shijiazhuang (CN); Jia Li, Shijiazhuang (CN); Cui Wei, Shijiazhuang (CN); Qingbin Liu, Shijiazhuang (CN); Zezhao He, Shijiazhuang (CN); Jingjing Wang, Shijiazhuang (CN)

(73) Assignee: THE 13TH RESEARCH INSTITUTE OF CHINA ELECTRONICS TECHNOLOGY GROUP CORPORATION, Shijiazhuang (CN)

( * ) Notice: Subject to any disclaimer, the term of this patent is extended or adjusted under 35 U.S.C. 154(b) by 0 days.

(21) Appl. No.: 14/762,388

(22) PCT Filed: Jul. 4, 2013

(86) PCT No.: PCT/CN2013/078836
§ 371 (c)(1),
(2) Date: Jul. 21, 2015

(87) PCT Pub. No.: WO2014/187022
PCT Pub. Date: Nov. 27, 2014

(65) Prior Publication Data
US 2015/0364567 A1      Dec. 17, 2015

(30) Foreign Application Priority Data

May 21, 2013   (CN) .......................... 2013 1 0189470

(51) Int. Cl.
*H01L 29/66*   (2006.01)
*H01L 29/423*   (2006.01)
(Continued)

(52) U.S. Cl.
CPC ...... *H01L 29/66045* (2013.01); *H01L 29/1606* (2013.01); *H01L 29/42364* (2013.01); *H01L 29/42376* (2013.01); *H01L 29/66439* (2013.01); *H01L 29/7781* (2013.01)

(58) Field of Classification Search
None
See application file for complete search history.

(56) References Cited

U.S. PATENT DOCUMENTS

| 8,445,893 B2 * | 5/2013 | Meric | ................ H01L 29/1606 257/29 |
| 2011/0114919 A1 | 5/2011 | Jenkins et al. | |

(Continued)

FOREIGN PATENT DOCUMENTS

KR    20130011966    1/2013

OTHER PUBLICATIONS

International Search Report of PCT/CN2013/078836 dated Mar. 6, 2014, 6 pages total (English translation provided).

*Primary Examiner* — Charles Garber
*Assistant Examiner* — Evren Seven
(74) *Attorney, Agent, or Firm* — Hamre, Schumann, Mueller & Larson, P.C.

(57) ABSTRACT

A method for manufacturing a graphene transistor based on self-aligning technology, the method comprising: on a substrate (1), forming sequentially graphene material (4), a metal film (5), and photoresist patterns (6) formed by lithography, removing the metal film and the graphene material uncovered by the photoresist, forming an active area, and metal electrodes (7, 8, 9) of a source, a gate, and a drain of the transistor, wherein the source electrode 7 and drain electrode 9 are connected with a metal of the active region, and forming gate photoresist patterns (10) between the source and the drain by lithography, etching off the exposed metal, forming sequentially a seed layer (11), a gate dielectric layer (12), and gate metal (13) on the exposed graphene surface, and finally forming a graphene transistor.

10 Claims, 9 Drawing Sheets

(51) Int. Cl.
*H01L 29/778* (2006.01)
*H01L 29/16* (2006.01)

(56) References Cited

U.S. PATENT DOCUMENTS

| | | | |
|---|---|---|---|
| 2011/0309334 A1 | 12/2011 | Chang et al. | |
| 2012/0256167 A1* | 10/2012 | Heo | H01L 29/1606 257/27 |
| 2013/0146846 A1* | 6/2013 | Adkisson | H01L 29/66045 257/27 |
| 2014/0001440 A1* | 1/2014 | Bojarczuk | H01L 29/517 257/27 |
| 2014/0138626 A1* | 5/2014 | Farmer | H01L 29/66045 257/29 |
| 2014/0335681 A1* | 11/2014 | Lee | H01L 21/02527 438/478 |
| 2015/0270406 A1* | 9/2015 | Sun | H01L 29/78606 257/29 |
| 2015/0364567 A1* | 12/2015 | Feng | H01L 29/42364 438/151 |

* cited by examiner

METHOD FOR MANUFACTURING GRAPHENE TRANSISTOR BASED ON SELF-ALIGNING TECHNOLOGY

TECHNICAL FIELD

The present application relates to the manufacture process of semiconductor device.

BACKGROUND

Graphene is a new carbonaceous material with ideal two-dimensional crystalline structure, at present it has the most outstanding conductivity performance, it has a saturation drift velocity of $5.5 \times 10^7$ cm/s, and a carrier mobility of greater than 200,000 cm$^2$/Vs, and it is suitable for making ultra-high frequency device. After recent several years of research and development, the current cut-off frequency $f_T$ of graphene transistor has reached 427 GHz, but it is still far from the ideal value, and the large resistance of access region is one of the main factors affecting the performance of graphene devices. As the size of a device decreases, the resistance of access region is substantially equivalent to the channel resistance of the device, which significantly affects the device performance. Therefore, the device performance can be improved by reducing the resistance of access region, i.e., reducing the spacings of the ungated region between the gate and the source contacts, between the gate and the drain contacts as much as possible. Meanwhile, because the graphene has special two-dimensional crystal structure, some water molecules and residual photoresist are easy to be absorbed onto the graphene surface in the device processing, resulting in doping and contamination to the obtained graphene material, which is another important factor affecting the performance of graphene device.

SUMMARY

The technical solution to be solved by the present application is to provide a method for manufacturing graphene transistor based on the self-aligning technology, which method can effectively avoid the pollution of the device processing technology to the graphene, at the same time decrease the spacings of the ungated region between the gate and the source contacts, between the gate and the drain contacts, so as to improve the performance of graphene transistor.

In order to solve the above technical problem, the present disclosure employs the following technical solution: a method for producing a graphene transistor based on self-aligning technology comprising the following steps:
1) forming a graphene layer on a substrate;
2) depositing a metal layer on the graphene layer;
3) covering a desired region with a photoresist pattern on the metal layer;
4) using the photoresist pattern as a mask to remove the exposed metal;
5) using the photoresist pattern as a mask to etch away the exposed graphene prior to removing the photoresist;
6) forming metal electrodes of a source electrode, a gate electrode and a drain electrode, wherein the source electrode and drain electrode are connected with a metal of an active region;
7) forming a gate mask pattern from a photoresist at the active region;
8) using the gate pattern of photoresist as a mask to remove the exposed metal;
9) forming a gate dielectric seed layer on the exposed graphene layer by using the gate pattern of photoresist as a mask;
10) forming a gate dielectric on the seed layer of the gate dielectric;
11) forming a gate metal on the gate dielectric and removing the photoresist.

Furthermore, the method further includes step 12) as follows: forming a self-aligning metal by means of the mask function of the gate metal with self-aligning, wherein the gate cap of the gate metal has a broader width than that of the gate base.

Furthermore, the substrate is an insulation layer which is made of $Si_xO_y$, $Si_xN_y$, BN, $Al_xO_y$, $Hf_xO_y$, $Al_xN_y$, SiC, Si, Sapphire, glass, polyethylene terephthalate (PET) material, polyimide (PT), polydimethyl siloxane or the combination thereof, wherein x=0.5 to 3, Y=0 to 2.

Furthermore, the substrate further includes a base layer beneath the insulation layer, wherein the base layer is made of semiconductor material, conductive material or one or more selected from the materials different from the material of insulation layer.

Furthermore, the graphene layer in the step 1) may be deposited directly or epitaxially grow on the substrate or another material, and it is transferred onto the substrate after peeling off, wherein the graphene layer may be a single layer or multiple layers.

Furthermore, the metal layer in the step 2) may be any metal that can be corroded by a chemical solution such as Au, Ti, Pt, Ag, Cr, Cu, Al or the combination thereof, and the metal layer may be formed by physical vapor deposition, chemical vapor deposition, vacuum evaporation, plating, chemical plating or the combination thereof. The metal layer has a thickness of from 0.1 nm to 1,000 nm. The photoresist pattern in the step 3) may be a desired pattern formed by lithography, and the pattern is a designed active region of graphene transistor. The removal of the exposed metal in the step 4) can be carried out by a chemical solution such as hydrofluoric acid, aqua regia, the mixed solution of potassium iodide and iodine, the mixed solution of ammonia and hydrogen peroxide, boric acid solution, hydrochloric acid solution or the mixed solution of nitric acid and acetic acid, leaving a metal layer on the active region of the graphene transistor. The exposed graphene layer in the step 5) can be removed by oxygen plasma etching or dry etching.

Furthermore, the metal electrodes of the source electrode, gate electrode, and drain electrode in the above step 6) can be selected from the group consisting of ruthenium, rhodium, palladium, silver, osmium, iridium, platinum, gold, titanium, aluminum, chromium, germanium, molybdenum, nickel, tungsten, copper, cobalt, iron, and the combination thereof, wherein the metal electrode has a thickness of from 0.1 nm to 1,000 nm; the photoresist gate mask pattern in the step 7) has one or more layers, wherein the gate pattern can be a straight gate, T gate, T-T gate, Y gate, Γ gate, or V gate. The exposed metal in the step 8) can be removed by a chemical solution such as hydrofluoric acid, aqua regia, the mixed solution of potassium iodide and iodine, the mixed solution of ammonia and hydrogen peroxide, boric acid solution, hydrochloric acid solution or the mixed solution of nitric acid and acetic acid.

Furthermore, the seed layer of the gate dielectric in the step 9) is formed from the absorbed $NO_2$, Polyvinyl alcohol (PVA), anthracene methanol or metal oxide, wherein the seed layer has a thickness of less than 10 nm; The gate dielectric in the step 10) is formed on the seed layer, wherein the gate dielectric may be selected from the group consisting of $HfO_2$, $ZrO_2$, $La_2O_3$, $Al_2O_3$, $TlO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, silicate and the combination thereof, wherein x=0.5 to 3, Y=0 to 2. The gate dielectric layer in the step 10) may be formed by physical vapor deposition (PVD), chemical vapor deposition (CVD), atomic layer vapor deposition (ALD), a molecular beam epitaxy (MBE), Sol-Gel process or the combination thereof.

Furthermore, the step 6) can be carried out after the step 11) or step 12).

Furthermore, the gate metal may be T shaped, T-T shaped, Y shaped, Γ shaped or V shaped.

The advantageous effects of the above technical solution are: the said method employs a metal mask, thereby the direct contact between the photoresist and graphene in this process can be avoided, so the pollution of the device processing to the graphene can be avoided. Meanwhile, the self-aligning process is employed, accordingly there are proper source-drain spacing and gate length, so the spacings of the ungated region between the gate and the source contacts, between the gate and the drain contacts are reduced, and the on-resistances between the gate and source, the gate and drain of the graphene transistor can be reduced, as a result the performance of the graphene transistor is improved.

BRIEF DESCRIPTION OF THE DRAWINGS

The present application will be described in detail in the following description with reference to the accompanying drawings and examples.

IN THE FIGURES

1: substrate, 2: insulation layer, 3: base layer, 4: graphene layer, 5: metal layer, 6: photoresist pattern, 7: source electrode, 8: gate electrode, 9: drain electrode, 10: gate mask pattern, 11: seed layer, 12: gate dielectric, 13: gate metal, 14. self-aligning metal.

DETAILED DESCRIPTION OF THE INVENTION

Figure 1:
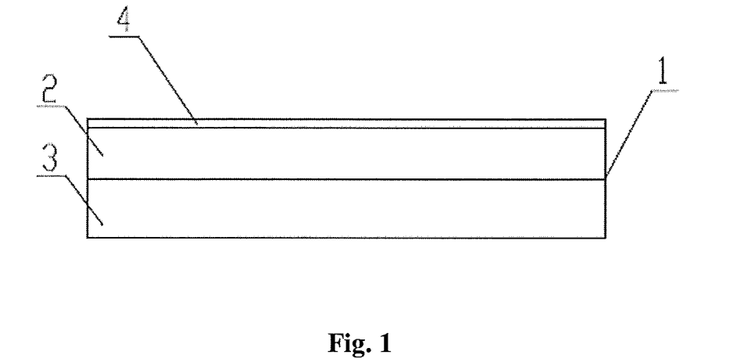
FIG. 1 is a structural schematic view of the graphene transistor obtained from step 1).
Figure 2:
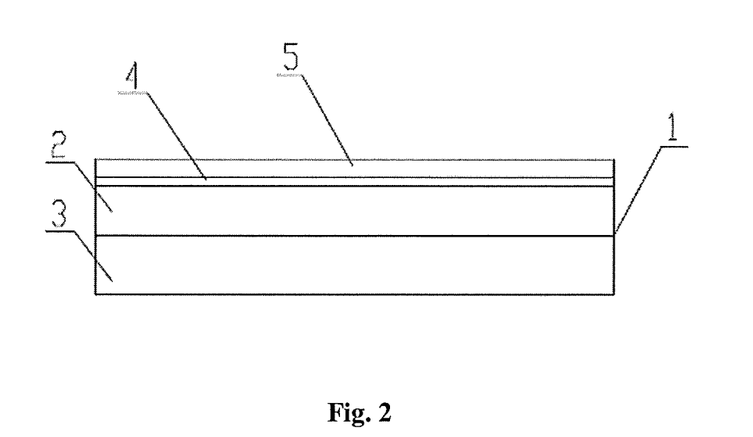
FIG. 2 is a structural schematic view of the graphene transistor obtained from step 2).
Figure 3:
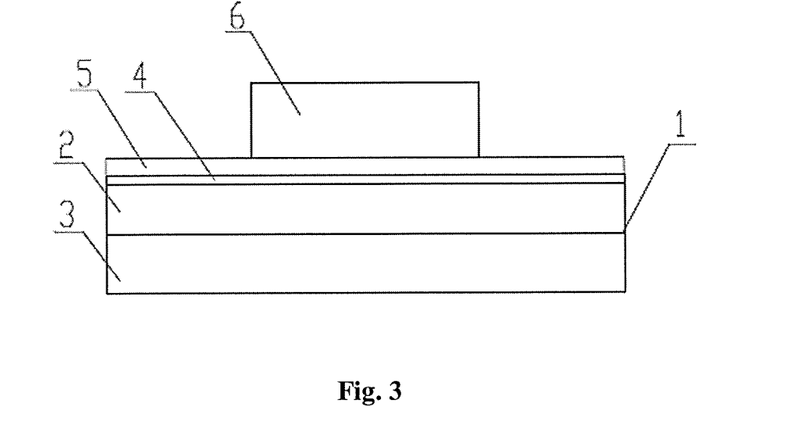
FIG. 3 is a structural schematic view of the graphene transistor obtained from step 3).
Figure 4:
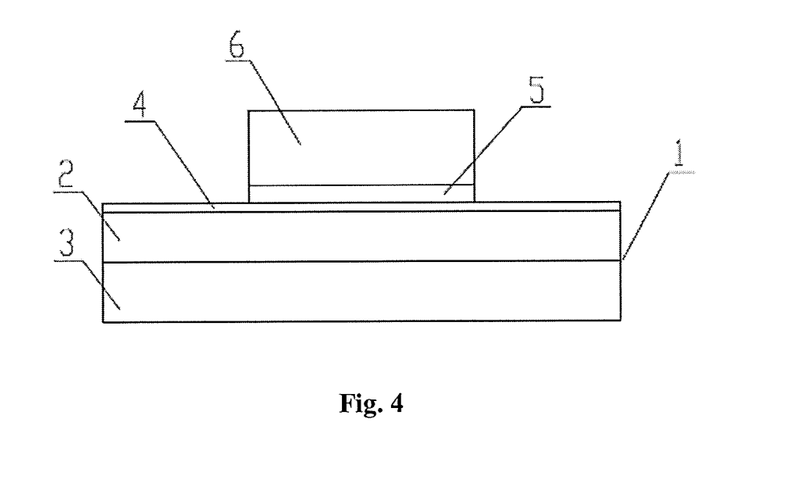
FIG. 4 is a structural schematic view of the graphene transistor obtained from step 4).
Figure 5:
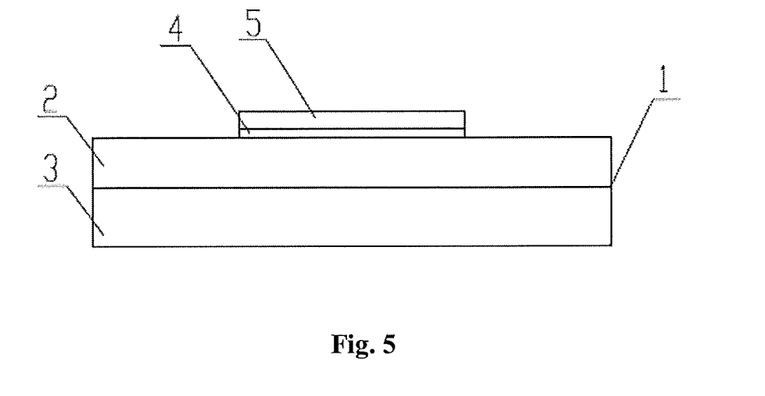
FIG. 5 is a structural schematic view of the graphene transistor obtained from step 5).
Figure 6:
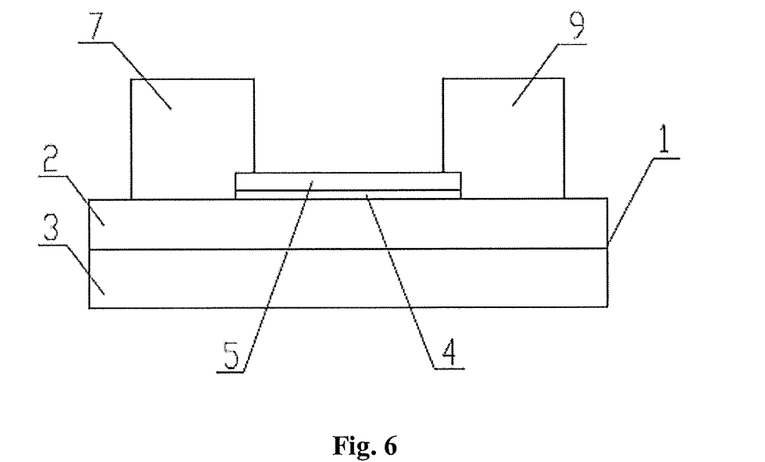
FIG. 6 is a structural schematic view of the graphene transistor obtained from step 6).
Figure 7:
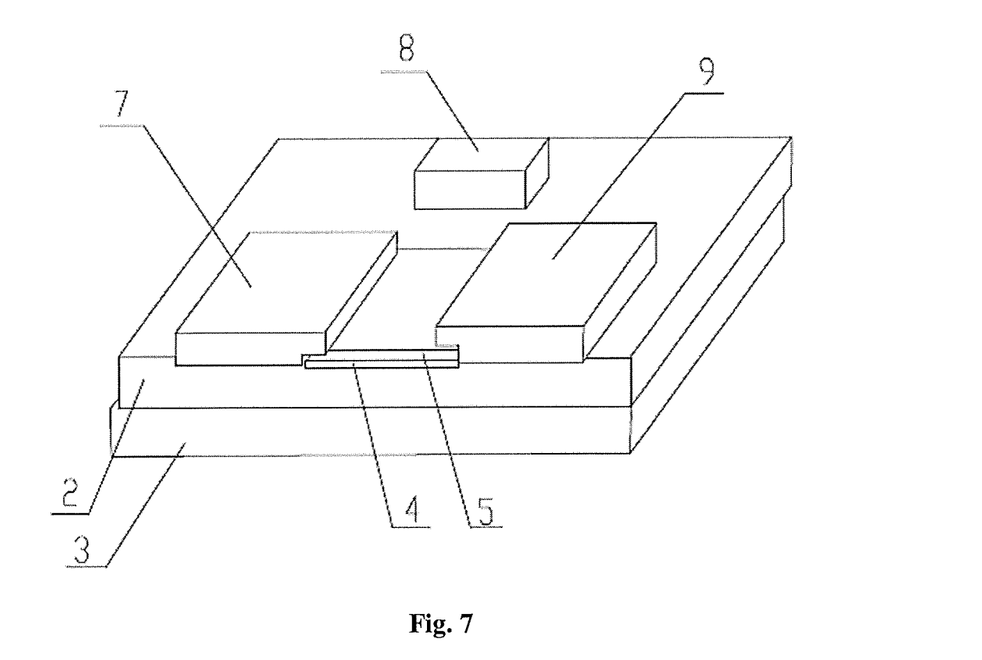
FIG. 7 is a perspective view of the graphene transistor obtained from step 6).
Figure 8:
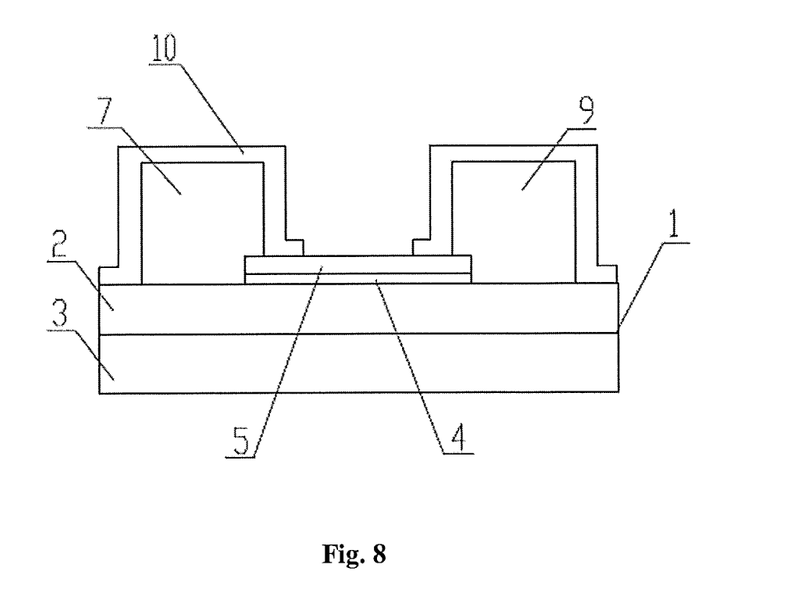
FIG. 8 is a structural schematic view of the graphene transistor obtained from step 7).
Figure 9:
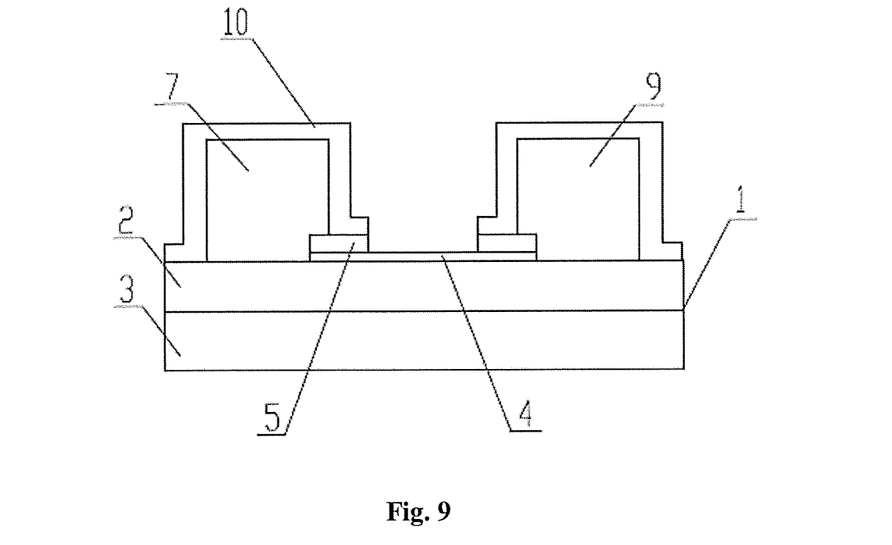
FIG. 9 is a structural schematic view of the graphene transistor obtained from step 8).
Figure 10:
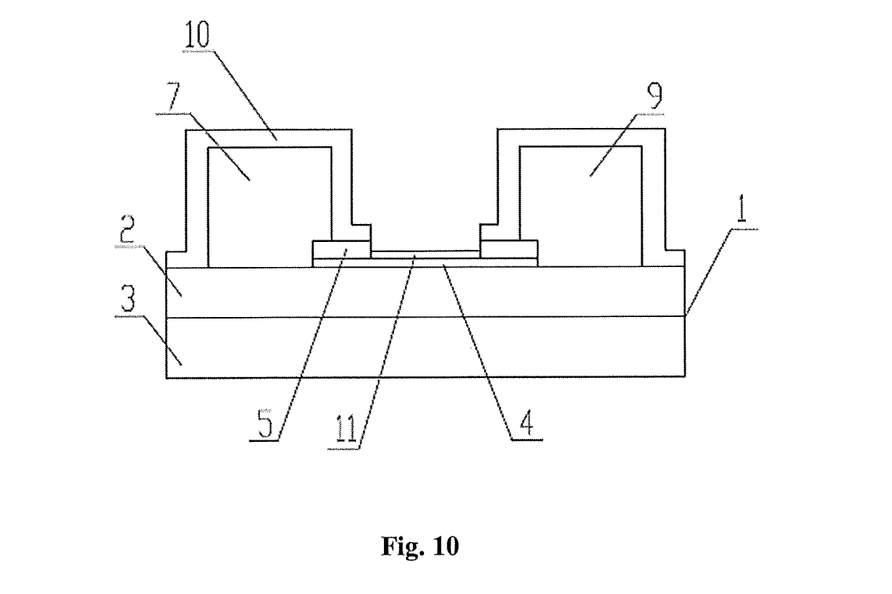
FIG. 10 is a structural schematic view of the graphene transistor obtained from step 9).
Figure 11:
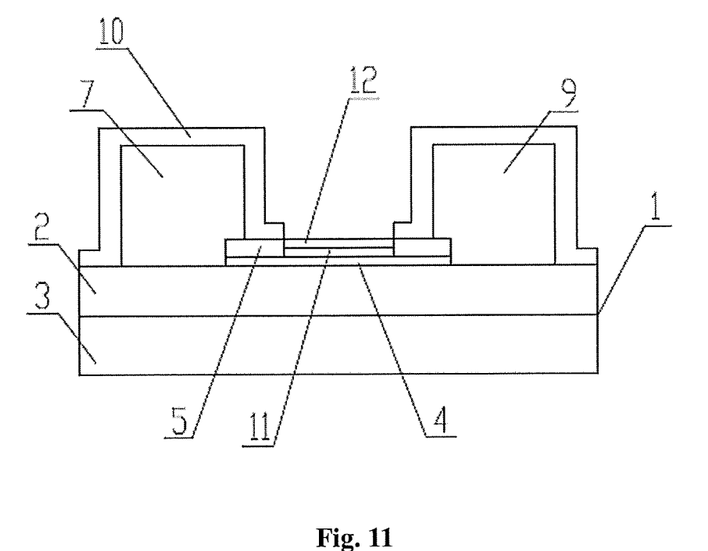
FIG. 11 is a structural schematic view of the graphene transistor obtained from step 10).
Figure 12:
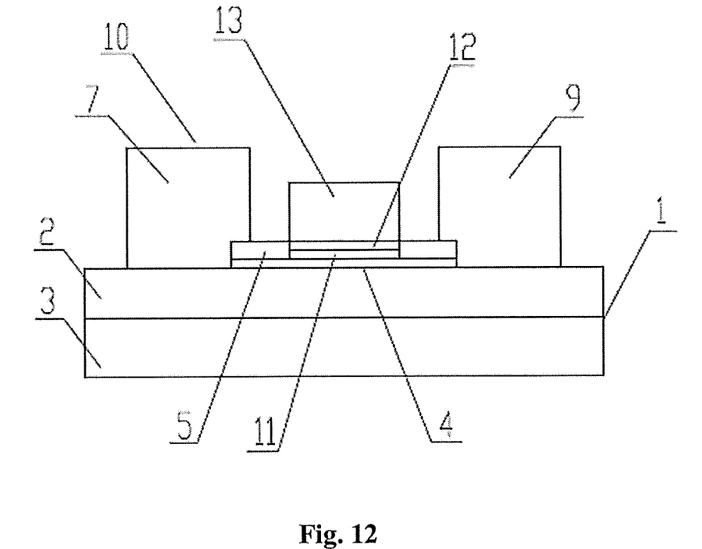
FIG. 12 is a structural schematic view of the first graphene transistor obtained from step 11).
Figure 13:
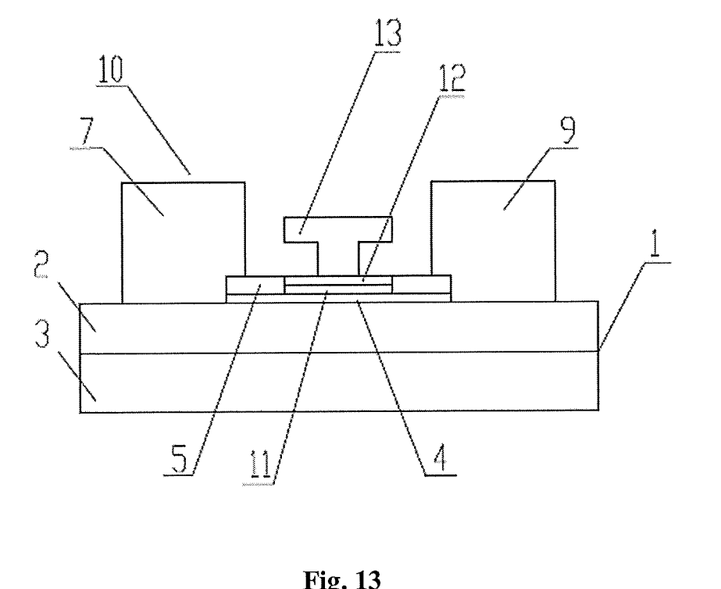
FIG. 13 is a structural schematic view of the second graphene transistor obtained from step 11).

A method for producing a graphene transistor based on self-aligning technology comprising the following steps:

1) forming a graphene layer 4 on a substrate 1, as shown in FIG. 1;
2) depositing a metal layer 5 on the graphene layer 4, as shown in FIG. 2;
3) covering a desired region on the metal layer 5 with a photoresist pattern 6, as shown in FIG. 3;
4) using the photoresist pattern 6 as a mask to remove the exposed metal, as shown in FIG. 4;
5) using the photoresist pattern 6 as a mask to etch away the exposed graphene prior to removing the photoresist, as shown in FIG. 5;
6) forming metal electrodes of a source electrode 7, gate electrode 8 and drain electrode 9, wherein the source electrode 7 and drain electrode 9 are connected with a metal of the active region, as shown in FIGS. 6 and 7;
7) forming a gate mask pattern 10 between the source electrode 7 and the drain electrode 9 from a photoresist, as shown in FIG. 8;
8) using the gate pattern of photoresist as a mask to remove the exposed metal, as shown in FIG. 9;
9) forming a gate dielectric seed layer 11 on the exposed graphene layer 4 by using the gate pattern of photoresist as a mask, as shown in FIG. 10;
10) forming a gate dielectric 12 on the gate dielectric seed layer, as shown in FIG. 11;
11) forming a gate metal 13 on the gate dielectric and removing the photoresist, as shown in FIG. 12;
12) forming a self-aligning metal by means of the mask function of the gate metal with self-aligning, wherein the gate cap of the gate metal has a broader width than that of the gate base, as shown in FIG. 13.

The substrate 1 in the step 1) can be an insulation layer 2 which includes a non-conductive dielectric material such as $Si_xO_y$, $Si_xN_y$, BN and the like, or a non-conductive metal oxide such as $Al_xO_y$, $Hf_xO_y$ and the like, or a non-conductive metal nitride such as $Al_xN_y$ and the like; or an insulating semiconductor material such as SiC, Si and the like, or an insulating material such as Sapphire, glass and the like; or an organic material such as Poly(ethylene terephthalate) material PET, polyimide PI film material, polydimethylsiloxane and the like; or a combination of at least two of the above materials. The substrate 1 may further include a material to form a base layer beneath the insulation layer, wherein the base layer can be made of semiconductor material, or a conductive material, or another insulating material different from the above mentioned material of the insulation layer or a combination of two different above materials. The graphene layer 4 in the step 1) may be deposited or epitaxially grow on the substrate or another material, and then it is transferred onto the substrate by peeling off, wherein the graphene layer may be a single layer or multiple layers.

The metal layer in the step 2) may be a metal that can be corroded by a chemical, it can be selected from the group consisting of gold, titanium and aluminum, and alternatively, it can be an alloy made from at least two of the above metals. The metal layer may be formed by physical vapor deposition, chemical vapor deposition, vacuum evaporation, plating, chemical plating or the combination thereof, a typical metal layer may have a thickness of from 1 nm to 100 nm, of course, and it can have smaller or thicker thickness.

The photoresist pattern in the step 3) may be a desired pattern formed by lithography. For example, it has a rectangular shape, and the rectangular area is designed to be the active region of a graphene transistor. The removal of the exposed metal layer in the step 4) can be carried out by chemical corrosion with a chemical solution such as hydrofluoric acid, aqua regia, the mixed solution of potassium iodide and iodine, the mixed solution of ammonia and hydrogen peroxide, boric acid solution, hydrochloric acid solution or the mixed solution of nitric acid and acetic acid, leavings a metal layer on the active region of the designed graphene transistor. The graphene material in the step 5) may be removed by etching process such as oxygen plasma etching, dry etching and the like.

With respect to the metal electrodes of the source, gate and drain electrodes, the metal thereof may be a noble metal or a general metal, for example, it can be selected from the group consisting of ruthenium, rhodium, palladium, silver, osmium, iridium, platinum, gold, titanium, aluminum, chromium, germanium, molybdenum, nickel, tungsten, copper, cobalt, iron, and the combination thereof, i.e. an alloy made of at least two above metals, and the metal may have a thickness of from 0.1 nm to 1,000 nm, and its thickness may be larger or smaller according to different demands. Regarding the production method of metal electrode please refer to the forming method of metal layer 5. The metal of the active region may be removed prior to forming the metal electrode of the source, gate and drain electrodes respectively, and the removal method is similar to the above step 4). The photoresist gate mask pattern in the step 7) may include more than one photoresist layers, and the gate mask pattern can be straight gate, T gate, T-T gate, Y gate, Γ gate, V gate and the like. The removal process of the metal in the step 8) is similar to the above step 4).

The seed layer of gate dielectric in the step 9) can be absorbed $NO_2$, or a layer of polymer such as polyvinyl alcohol PVA, anthracene methanol and the like, or a layer of metal, and then a metal oxide is formed, typically the metal has a thickness of less than 2 nm. The metal can be formed by physical vapor deposition, chemical vapor deposition, vacuum evaporation, magnetron sputtering and the like. After that the metal is put into an environment containing oxygen such as air, a container containing oxygen or the like, so as to form a metal oxide, a typical example is Al, it is oxidized in air to obtain $Al_2O_3$ as a seed layer which has a thickness of less than 10 nm, and the thickness of the seed layer may vary according to different types of dielectric.

The gate dielectric is formed on the seed layer in the above step 10), the gate dielectric may be made of oxide(s) or nitrogen oxide(s), such as $HfO_2$, $ZrO_2$, $La_2O_3$, $Al_2O_3$, $TlO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, silicate, or the combination thereof, wherein the value of x is in the range of from 0.5 to 3, the value of Y is in the range of from 0 to 2. The gate dielectric layer may be formed by physical vapor deposition (PVD), chemical vapor deposition (CVD), atomic layer vapor deposition (ALD), molecular beam epitaxy (MBE) Sol-Gel or the combination thereof.

Figure 14:
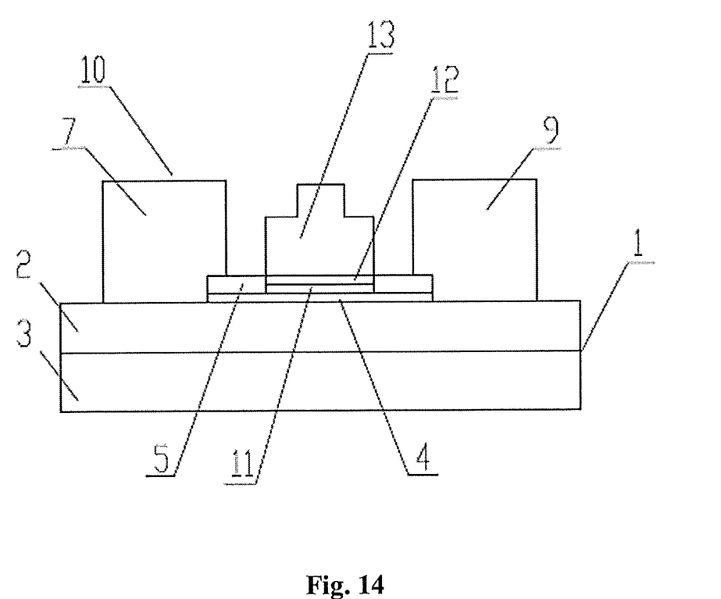
FIG. 14 is a structural schematic view of the third graphene transistor obtained from step 11).

The gate metal 13 in the above step 11) can be a noble metal or a general metal, it can be selected from the group consisting of ruthenium, rhodium, palladium, silver, osmium, iridium, platinum, gold, titanium, aluminum, chromium, germanium, molybdenum, nickel, tungsten, copper, cobalt, iron, and an alloy made from at least two of the above metals. The metal has a thickness of from 0.1 nm to 1,000 nm, and the thickness thereof can be larger or smaller according to different demands. The production method of metal electrode is similar to the forming method of metal layer 5. The gate metal 13 may be a straight gate, as shown in FIG. 12, alternatively, the upper portion of the gate can be larger than the lower portion thereof, for example, it can be a T shaped gate, TT-shaped gate, Y shaped gate, Γ shaped gate, V shaped gate, and the like, as shown in FIG. 13, alternatively the upper portion of the gate can be smaller than the lower portion thereof, e.g., it is an inverted trapezoid gate and the like, as shown in FIG. 14.

Figure 15:
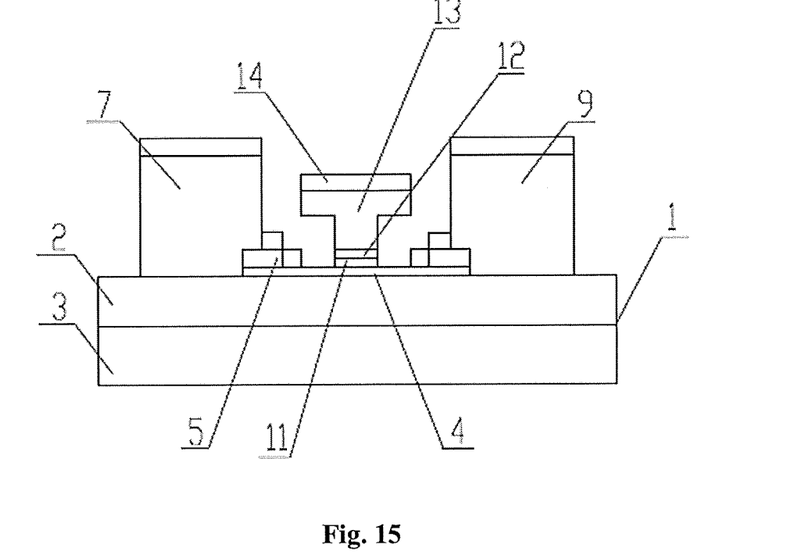
FIG. 15 is a structural schematic view of the graphene transistor obtained from step 12).
Figure 16:
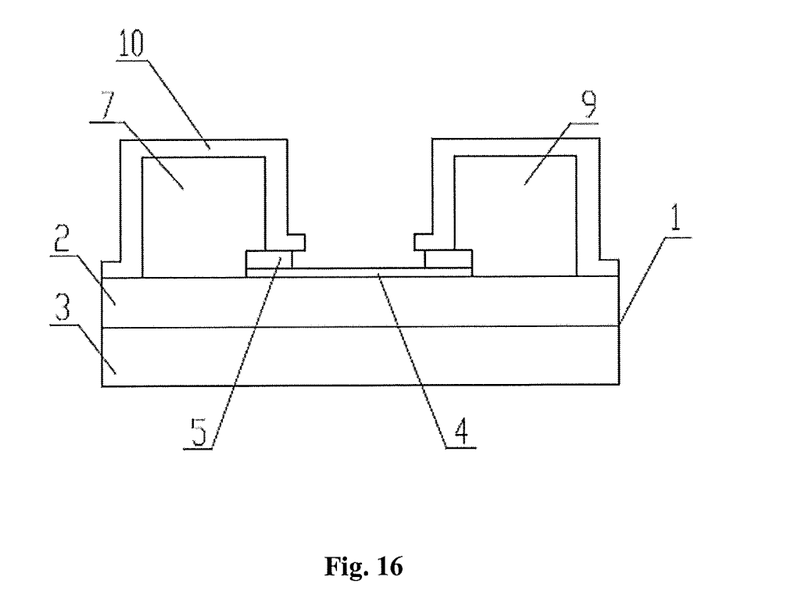
FIG. 16 is a structural schematic view of a graphene transistor obtained from step 4) when the undercutting occurs in the corrosion of metal.
Figure 17:
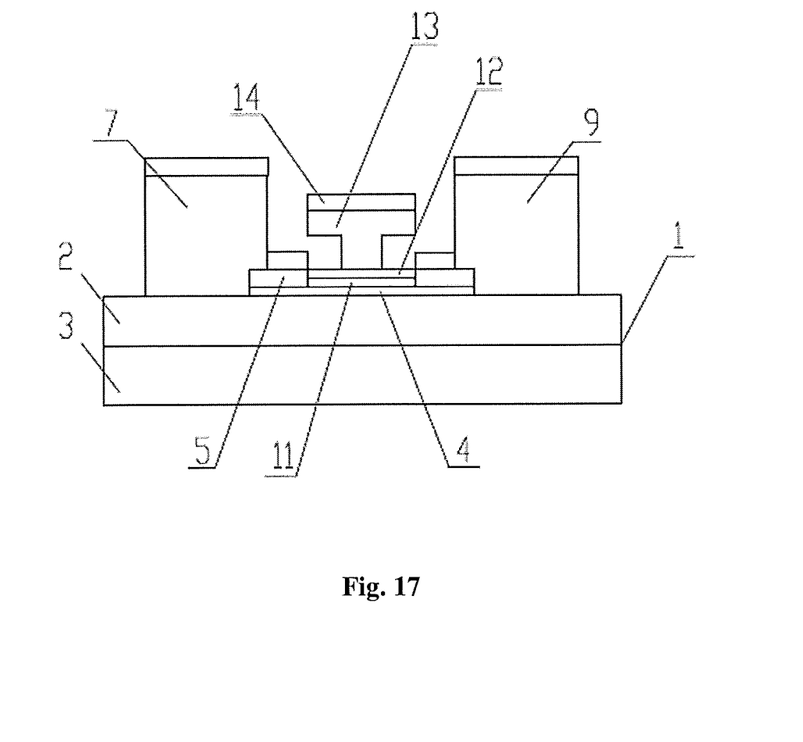
FIG. 17 is a structural schematic view of the graphene transistor obtained with the self-aligning technology.

The gate metal 13 in the above step 11) may be a metal that can form an oxide film on the surface thereof by self-oxidation, for example, this metal may be Al, Ti, or the combination thereof, in this case the above steps 9) and 10) can be omitted. The type, thickness and production method of the self-aligning metal in the step 12) can also refer to those of gate metal, alternatively this step can be cancelled. If the undercutting occurs in the erosion of the metal in the step 4), as shown in FIG. 16, the photoresist mask pattern and gate metal in the steps 7) and 11) may both have a shape of larger upper portion of gate than lower portion, in this case, it is optionally that a self-aligning metal is formed by means of the mask function of the gate metal in the step 12), wherein the spacings of the ungated region between the gate and the source contacts, between the gate and the drain contacts can be reduced by self-aligning, as shown in FIGS. 15 and 17. The step 6) can be carried out after the step 11) or step 12).

The present method can effectively avoid the pollution of the device processing technology on the graphene, meanwhile decrease the spacings of the ungated region between the gate and the source contacts, between the gate and the drain contacts, thereby the performance of graphene transistor can be improved.

In the present disclosure, the principles and specific embodiments of the present application are described with reference to specific examples which are only used to facilitate to appreciate the method and its core idea of the present application. It should be noted that those of ordinary skill in the art will understand that, any improvement and modification can be made without departing from the principles of the present application, and these improvements and modifications would also fall within the scope of the claims of the present application.

We claim:

1. A method for producing a graphene transistor based on self-aligning technology comprising:
   forming a graphene layer on a substrate;
   depositing a metal layer on the graphene layer;
   covering a desired region on the metal layer with a first photoresist pattern;
   using the first photoresist pattern as a mask to remove a first exposed portion of the metal;
   using the first photoresist pattern as a mask to etch away an exposed portion of the graphene layer prior to removing the first photoresist;
   forming metal electrodes of a source electrode and drain electrode, wherein the source electrode and drain electrode are connected with a remaining portion of the metal layer corresponding to an active region;
   forming a gate mask pattern from a second photoresist to expose a second portion of the metal layer between the source electrode and the drain electrode;
   using the gate mask pattern of the second photoresist as a mask to remove the second portion of the exposed metal thereby exposing a portion of the graphene layer;

forming a gate dielectric seed layer on the exposed portion of the graphene layer by using the gate pattern of the second photoresist as a mask;

forming a gate dielectric on the gate dielectric seed layer;

forming a gate electrode on the gate dielectric and then removing the photoresist.

2. The method of claim 1, wherein forming a gate electrode further comprises the following step: forming a metal layer, wherein a gate cap of the gate metal layer has a larger width than that of a gate base.

3. The method of claim 1, wherein the substrate comprises an insulation layer made of $Si_xO_Y$, $SiXN_Y$, BN, $AlXO_Y$, $Hf_xO_Y$, $Al_xN_Y$, SiC, Si, Sapphire, glass, polyethylene terephthalate material, polyimide, polydimethyl siloxane or the combination thereof, wherein x=0.5 to 3, Y=0 to 2.

4. The method of claim 2, wherein the substrate further comprises a base layer beneath the insulation layer, wherein the base layer is made of semiconductor material, conductive material or one or more materials different from the material of insulation layer.

5. The method of claim 1, wherein the graphene layer is deposited directly or epitaxially grown on the substrate or another material, and it is transferred onto the substrate by peeling off, and further wherein the graphene layer has one or more layers.

6. The method of claim 1, wherein the metal layer is a metal that can be corroded by a chemical solution, which is selected from the group consisting of Au, Ti, Pt, Ag, Cr, Cu, Al, and the combination thereof; the metal layer is formed by physical vapor deposition, chemical vapor deposition, vacuum evaporation, plating, chemical plating or the combination thereof, wherein the metal layer has a thickness of from 0.1 nm to 1,000 nm; the first photoresist pattern is a desired pattern formed by lithography, and the pattern is a designed active region of graphene transistor; the first portion of exposed metal is removed by hydrofluoric acid, aqua regia, the mixed solution of potassium iodide and iodine, the mixed solution of ammonia and hydrogen peroxide, boric acid solution, hydrochloric acid solution or the mixed solution of nitric acid and acetic acid, leaving a metal layer on the active region of graphene transistor; the exposed graphene layer is removed by oxygen plasma etching or dry etching.

7. The method of claim 1, wherein the metal electrodes of the source electrode, gate electrode, and drain electrode are respectively made of one or more selected from the group consisting of ruthenium, rhodium, palladium, silver, osmium, iridium, platinum, gold, titanium, aluminum, chromium, germanium, molybdenum, nickel, tungsten, copper, cobalt, and iron, and the metal electrodes have a thickness of from 0.1 nm to 1,000 nm respectively; the photoresist gate mask pattern has one or more layers, wherein the gate pattern is a straight gate, T gate, T-T gate, Y gate, r gate, or V gate; the second portion of exposed metal is removed by hydrofluoric acid, aqua regia, the mixed solution of potassium iodide and iodine, the mixed solution of ammonia and hydrogen peroxide, boric acid solution, hydrochloric acid solution, or the mixed solution of nitric acid and acetic acid.

8. The method of claim 1, wherein the seed layer of the gate dielectric is formed from an absorbed NO2, Polyvinyl alcohol, Anthracenemethanol or metal oxide, wherein the seed layer has a thickness of less than 10 nm; the gate dielectric is formed on the seed layer, wherein the gate dielectric is selected from the group consisting of $HfO_2$, $ZrO_2$, $La_2O_3$, $Al_2O_3$, $TiO_2$, $SrTiO_3$, $LaAlO_3$, $Y_2O_3$, $HfO_xN_Y$, $ZrO_xN_Y$, $La2O_xN_Y$, $Al_2O_xN_Y$, $TiO_xN_Y$, $SrTiO_xN_Y$, $LaAlO_xN_Y$, $Y_2O_xN_Y$, silicate and the combination thereof, wherein x=0.5 to 3, Y=0 to 2; the gate dielectric layer is formed by physical vapor deposition, chemical vapor deposition, atomic layer vapor deposition, molecular beam epitaxy, Sol-Gel process or the combination thereof.

9. The method of claim 1, wherein the step of forming metal electrodes is carried out after the steps of forming a gate dielectric or forming a gate metal.

10. The method of claim 2, wherein the gate electrode is T shaped, T-T shaped, Y shaped, r shaped or V shaped.

\* \* \* \* \*